United States Patent
Kohl et al.

(10) Patent No.: US 11,946,949 B2
(45) Date of Patent: Apr. 2, 2024

(54) METHOD AND CONTROL UNIT FOR DEMODULATION

(71) Applicant: Technische Universität Wien, Vienna (AT)

(72) Inventors: Dominik Kohl, Wolkersdorf (AT); Mathias Poik, Vienna (AT); Georg Schitter, Vienna (AT)

(73) Assignee: TECHNISCHE UNIVERSITÄT WIEN, Vienna (AT)

( * ) Notice: Subject to any disclaimer, the term of this patent is extended or adjusted under 35 U.S.C. 154(b) by 301 days.

(21) Appl. No.: 17/293,308

(22) PCT Filed: Nov. 12, 2019

(86) PCT No.: PCT/EP2019/080932
§ 371 (c)(1),
(2) Date: Oct. 18, 2021

(87) PCT Pub. No.: WO2020/099357
PCT Pub. Date: May 22, 2020

(65) Prior Publication Data
US 2022/0120783 A1    Apr. 21, 2022

(30) Foreign Application Priority Data

Nov. 14, 2018    (AT) .............................. A 50993/2018

(51) Int. Cl.
G01Q 20/04    (2010.01)
G01Q 60/38    (2010.01)
H03D 3/02    (2006.01)

(52) U.S. Cl.
CPC ............. *G01Q 20/04* (2013.01); *G01Q 60/38* (2013.01); *H03D 3/02* (2013.01)

(58) Field of Classification Search
None
See application file for complete search history.

(56) References Cited

U.S. PATENT DOCUMENTS

| 5,386,720 A | * | 2/1995 | Toda ...................... B82Y 35/00 250/307 |
| 5,742,377 A | | 4/1998 | Minne et al. |

(Continued)

OTHER PUBLICATIONS

Caruso, Laure, et al.; "In Vivo Magnetic Recording of Neuronal Activity"; Neuron, Neuroresource, vol. 95, Issue 6; Aug. 24, 2017; 14 Pages.

(Continued)

*Primary Examiner* — Eliza W Osenbaugh-Stewart
(74) *Attorney, Agent, or Firm* — Husch Blackwell LLP

(57) ABSTRACT

A method for demodulation including the following steps: exciting a vibrationally mounted, at least sectionally bar-shaped oscillating element for oscillating in the range of a resonance frequency of the oscillating element, wherein a temporally varying, in particular periodic, excitation signal is used for excitation, and wherein at least the temporal variation of the excitation signal is known or determined; detecting a modulated oscillation of the oscillating element by means of at least one sensor, wherein the sensor supplies a sensor measurement variable that varies versus time as a function of an amplitude and a phase of the modulated oscillation of the oscillating element. According to the present teaching, it is provided that the method includes the following step: generate a first comparison signal by amplitude modulating a known temporally varying, in particular periodic, demodulation signal by means of the temporally varying sensor measurement variable.

27 Claims, 4 Drawing Sheets

(56) References Cited

U.S. PATENT DOCUMENTS 7,462,270 B2 12/2008 Naughton
2008/0216583 A1 9/2008 Bargatin et al.

OTHER PUBLICATIONS

Ruppert, Michael G., et al.; "A review of demodulation techniques for amplitude-modulation atomic force microscopy"; Beilstein Journal of Nanotechnology, vol. 8, No. 1; Jul. 10, 2017; 20 Pages.
Martin Fischeneder, et al.; "Tuneable Q-Factor of MEMS Cantilevers with Integrated Piezoelectric Thin Films"; Institute of Sensor and Actuator Systems, TU Wien, 1040 Vienna, Austria; Sensors, MDPI Journal, vol. 18, No. 11; Nov. 9, 2018; 12 Pages.
International Search Report and Written Opinion of the International Searching Authority; Application No. PCT/EP2019/080932; Completed: Feb. 7, 2020; dated Feb. 17, 2020; 9 Pages.

* cited by examiner

METHOD AND CONTROL UNIT FOR DEMODULATION

TECHNICAL FIELD

The present teaching relates to a method for demodulation comprising the following steps:—exciting a vibrationally mounted, at least sectionally bar-shaped oscillating element for oscillating in the range of a resonance frequency of the oscillating element, wherein a temporally varying, in particular periodic, excitation signal is used for excitation, and wherein at least the temporal variation of the excitation signal ($u_{act}$) is known or determined; —detecting a modulated oscillation of the oscillating element by means of at least one sensor, wherein the sensor supplies a sensor measurement variable that varies versus time as a function of an amplitude and a phase of the modulated oscillation of the oscillating element.

Furthermore, the present teaching relates to a control unit for demodulation, wherein the control unit can be connected to at least one excitation means for exciting a vibrationally mounted, at least sectionally bar-shaped oscillating element, wherein the control unit can be connected to at least one sensor for detecting a modulated oscillation of the oscillating element.

BACKGROUND

In many areas of the technology, in particular metrology, oscillating elements that are in particular at least sectionally bar-shaped are excited to oscillate in the range of a resonance frequency of the respective oscillating element. The oscillations of the oscillating element are generally modulated by interactions of the oscillating element with its environment, in which an object to be examined can be located. In order to be able to draw conclusions about the environment or the object to be examined, the amplitude and/or phase of the modulated oscillation are then determined, which is usually associated with considerable technical and financial expense, for example by using lock-in amplifiers with a high bandwidth.

An example of this metrology is the atomic force microscopy, which is used for analyzing surfaces with resolutions in the subnanometer range. The surface to be examined is sampled by an oscillating element formed as a (micro) cantilever. Different operating modes are used for surface analysis. In amplitude-modulated atomic force microscopy (AM-AFM), the cantilever is excited to oscillate, and the change in oscillation amplitude is measured and controlled by interaction forces with the surface. One possibility for measuring the deformation or oscillation of the cantilever is the use of piezoresistive sensors. The piezoresistive sensors can be integrated on the cantilever, whereby this is also referred to as a piezoresistive cantilever. The deformation of the cantilever leads to a change in the electrical resistance of the piezoresistive sensors. The piezoresistive cantilever is typically connected in a bridge circuit. The change in resistance therefore leads to a voltage differential at the bridge proportional to the deformation of the cantilever, which is typically amplified by means of an operational amplifier.

In order to determine the oscillation amplitude, the voltage differential is demodulated according to the prior art by means of a lock-in amplifier. However, lock-in amplifiers that achieve a low-noise demodulation with the required high bandwidth are complex and expensive.

Other known demodulation techniques, which are less complex, have serious disadvantages, since they are very strongly influenced by noise on the one hand and, on the other hand, react very sensitively to the presence of other frequency components of the cantilever, cf. e.g., M. G. Ruppert et al., "*A review of demodulation techniques for amplitude-modulation atomic microscopy*" in Beilstein Journal of Nanotechnology, Vol. 8, No. 1, pp. 1407-1426, 2017.

Fischeneder M. et al., "Tuneable Q-Factor of MEMS Cantilevers with Integrated Piezoelectric Thin Films", Sensors 18, 3842 (2018), describes a piezoelectric element integrated on the cantilever that generates an AC voltage proportional to the oscillation. The oscillation is subsequently manipulated with the additive overlay of an AC voltage of the same frequency.

However, since the additive overlay does not result in a modulation or demodulation—i.e., in a multiplication of a signal proportional to the oscillation with another signal, or in other words in an amplitude modulation that always has a multiplicative effect—the amplitude and/or the phase of the oscillation cannot be determined with this method.

U.S. Pat. No. 7,462,270 B2 describes that a sensor element can be integrated into a cantilever in a bridge circuit that can be operated at the resonance frequency of the cantilever. Whether or even how the oscillation of the cantilever can be demodulated is not disclosed, nor how the oscillation of the cantilever is generated.

Caruso L. et al., "In Vivo Magnetic Recording of Neuronal Activity", Neuron 95, 1283 (2017), describes a GMR sensor for measuring magnetic fields that is operated in an amplitude-modulated manner to improve the measurement quality. However, this sensor is not mounted on an oscillating element excited to oscillate, and this disclosure also makes no reference of any kind to the excitation of mechanical oscillations.

SUMMARY

It is therefore one object of the present teaching to provide a method and means for demodulation that avoid the aforementioned disadvantages and are technically simpler and above all more cost-effective than known solutions, in particular given a reliable demodulation.

In order to solve the aforementioned task, a method for demodulation comprises the following steps:
  exciting a vibrationally mounted, at least sectionally bar-shaped oscillating element for oscillating in the range of a resonance frequency of the oscillating element, wherein a temporally varying, in particular periodic, excitation signal is used for excitation, and wherein at least the temporal variation of the excitation signal
  is known or determined; —detecting a modulated oscillation of the oscillating element by means of at least one sensor, wherein the sensor supplies a sensor measurement variable that varies over time as a function of an amplitude and a phase of the modulated oscillation of the oscillating element;
  the present teaching specifies that the method comprises the following steps:
  generate a first comparison signal by amplitude modulating a known temporally varying, in particular periodic, demodulation signal by means of the temporally varying sensor measurement variable.

As explained in more detail below, the first comparison signal generated by the above-mentioned combination of the demodulation signal with the sensor measurement variable, more precisely the constant component of the first comparison signal, is proportional to the amplitude of the modulated oscillation or directly dependent on the phase of the modulated oscillation. This means that the first comparison signal provides the desired information about the amplitude or phase of the modulated oscillation, wherein the information about the ratio (instead of the exact numerical value) of the temporally varying amplitude of the modulated vibration is already sufficient for many applications.

The modulated oscillation of the oscillating element is demodulated, wherein said modulation is typically caused by the interaction of the oscillating element with its environment, in particular with at least one object that is to be examined and arranged in the environment. This results in a wide range of potential applications, for example for measuring the density of the medium surrounding the oscillating element or for measuring vibrations of the medium surrounding the oscillating element. This means that the potential applications of the method according to the present teaching go far beyond atomic force microscopy.

Another case, which is to be explicitly mentioned in this context and which is discussed in more detail below, is one wherein the excitation signal has the amplitude or phase to be determined, wherein the oscillation of the oscillating element is not only excited, but is also modulated, by the excitation signal. For example, the excitation signal can be an electromagnetic radio signal for which only the temporal variation is known or determined and whose amplitude or phase is to be determined. An oscillating element that is excited to oscillate by such a radio signal can for example be a cantilever suitably formed in the basically known manner, e.g. in that the cantilever consists of piezoelectric material that is equipped with electrodes and can therefore be excited to oscillate by electrical signals.

If the oscillating element is a cantilever of an atomic force microscope (AFM), the interaction forces, in particular the Van der Waals forces, result in said modulation of the oscillations of the cantilever between a surface to be examined and a tip of the cantilever.

"Bar-shaped" is to be understood here and in the following with the greatest possible generality, so that the at least one bar-shaped section of the oscillating element does not necessarily have to be formed linear or straight. For example, this means that a round, circular or circular segment-shaped oscillating element is sectionally bar-shaped in the sense of the present application.

Likewise, "vibrationally mounted" is to be understood here and in the following with the greatest possible generality. Here, the oscillating element does not necessarily have to be movable as a whole in relation to another element. In particular, it is conceivable that the oscillating element is sectionally clamped, in particular at one end, in the sense of a mounting point from the field of statics. In other words, the oscillating element could be sectionally rigidly connected to the further element. The oscillating element, for example a cantilever, can still oscillate with at least one not clamped section. Accordingly, the vibrationally mounted oscillating element can be formed analogously to a bar clamped on one side. The clamping can also be effected by manufacturing the oscillating element as a single piece (for example the cantilever) with the further, substantially rigid element.

In principle, the excited oscillations of the oscillating element can be arbitrary oscillations, i.e., it does not necessarily have to be the 1st harmonic of the oscillating element.

The excitation signal does not necessarily have to be periodic, but—except for random deviations—could for example be periodic, or "almost periodic", or could also consist of one or more pulses with a spectrum of frequencies or comprise one or more such pulses. For some applications, the targeted use of such pulse-like signals can be advantageous, in particular if the signal-to-noise ratio can be improved, which can justify an increased effort in signal preparation and signal evaluation.

If the excitation signal is periodic, it does not necessarily have to be sinusoidal, but can for example also be formed by means of at least one rectangular oscillation or triangular oscillation.

The modulated oscillation of the oscillating element is detected by means of one or more sensors. This can for example be at least one optical sensor that for example detects a signal of a laser in order to determine deflections and thus oscillations of the oscillating element, and that comprises an electrical value, in particular a voltage, as the temporally varying sensor measurement variable. A further example of a suitable sensor would be a capacitive sensor, which primarily has an electrical capacitance as a temporally varying sensor measurement variable in order to be able to determine deflections and thus oscillations of the oscillating element. A further example of a suitable sensor would be a piezo-resistive sensor, which has an electrical resistance as a temporally varying sensor measurement variable in order to be able to determine deflections and thus oscillations of the oscillating element.

What was stated above regarding the excitation signal applies analogously for the demodulation signal, e.g., the demodulation signal does not necessarily have to be periodic, but—except for random deviations—could for example be periodic, or "almost periodic", or could also consist of one or more pulses with a spectrum of frequencies or comprise one or more such pulses. If the demodulation signal is selected to be periodic, it does not necessarily have to be sinusoidal, but can for example also be formed by means of at least one rectangular oscillation or triangular oscillation. The decisive factor is that the temporally varying demodulation signal is known.

In particular, it is advisable to use the excitation signal or a signal derived from the excitation signal as a demodulation signal, e.g. by using a phase shift and/or by multiplying the excitation signal. For example, precisely the excitation signal or an integer multiple (e.g., double) of the excitation signal can be used as a demodulation signal, in each case except for a possible phase shift.

The modulated oscillation of the oscillating element is overlaid onto the first comparison signal by the amplitude modulation of the demodulation signal by means of the temporally varying sensor measurement variable.

The first comparison signal generally consists of a constant component and a temporally varying component, wherein the amplitude of the modulated oscillation of the oscillating element acts as a proportionality factor for both components. This means that both the constant component and the amplitude of the temporally varying portion of the first comparison signal are proportional to the amplitude of the modulated oscillation of the oscillating element, wherein the remaining factors are generally known and comprise the amplitude of the excitation signal. In other words, by generating the first comparison signal, the amplitude of the modulated oscillation of the oscillating element can be directly inferred, whereby a wide variety of options for suitable further processing of the difference signal are available for this purpose.

The constant component of the first comparison signal is generally a function of the phase of the demodulation signal and the phase of the modulated oscillation of the oscillating element, in particular a function of the addition and/or subtraction of the phase of the demodulation signal and the phase of the modulated oscillation of the oscillating element. In principle, the phase of the demodulation signal can therefore be appropriately varied to determine the phase of the modulated oscillation of the oscillating element.

Preferably, not only the temporal variation of the excitation signal is known, but also its amplitude, particularly preferably also its phase. If applicable, at least one further detection means or further sensor can be provided for determining the temporal variation and/or amplitude and/or the phase of the excitation signal.

However, as can be seen from the above, the excitation signal does not have to be fully known or determined.

In other words, cases are also possible for which only the temporal variation, i.e. the relative amplitude change versus time, is known from the excitation signal. Typically, this is the case in the above example of a radio signal as an excitation signal, since at least the frequency of the radio signal to be determined is usually known. In this case, it is advisable to select the temporal variation of the demodulation signal equal to the temporal variation of the excitation signal.

Furthermore, cases are also possible for which the temporal variation of the excitation signal is not known in advance, but is initially determined. This can occur, for example, by means of the oscillating element itself, which is excited to oscillate by continuously adjusting the temporal variation, in particular the frequency, of the demodulation signal to the temporal variation, in particular the frequency, of the excitation signal, wherein the adjustment is made to maximize the constant component of the first comparison signal. This adjustment or control can for example be carried out by means of a known phase control loop.

Analogously to what is stated above, the present teaching specifies for a control unit for demodulation—wherein the control unit can be connected to at least one excitation means for exciting a vibrationally mounted, at least sectionally bar-shaped oscillating element, wherein the control unit can be connected to at least one sensor for detecting a modulated oscillation of the oscillating element—that the control unit is equipped to execute a method according to the present teaching.

The connection between the control unit and the at least one excitation means and/or the at least one sensor does not have to be wired, but can for example also be radio-based.

The connection between the control unit and the at least one excitation means and/or the at least one sensor is also not necessarily to be understood as a "direct" connection, but can also be formed as an "indirect" connection, wherein one or more elements are incorporated between the control unit and the excitation means and/or the at least one sensor. In particular, such an indirect connection can contain one or more electronic components or circuitry. Such an indirect connection between the control unit and the at least one sensor element would be given, for example, by feeding the control unit with the difference signal or a signal generated by further processing of the difference signal.

The excitation signal is the excitation means in the case described above, wherein the excitation signal itself is causally responsible for the modulation of the oscillation of the oscillating element and ultimately has the amplitude or phase to be determined. In this case, an indirect connection between the excitation means and the control unit can be generated by the oscillating element and the at least one sensor.

For example, the excitation signal or the excitation means can be a (electromagnetic) radio signal whose amplitude or phase is to be determined. The radio signal excites the oscillating element to oscillate, and the (modulated) oscillation of the oscillating element is detected by means of the at least one sensor. By connecting the control unit to the sensor, an indirect connection of the control unit to the excitation means or the radio signal is then also given in any case.

In addition, the control unit can of course also be directly or indirectly connected to other elements, e.g., not only to the at least one excitation means and/or the at least one sensor. In particular, it is conceivable that the control unit is used for generating the demodulation signal and/or the second comparison signal. In addition, the excitation signal can also be supplied to the control unit, or the control unit can be used for generating the excitation signal, wherein the latter can represent an indirect connection between the control unit and the excitation means.

The control unit is in particular equipped to execute or control at least the following steps:

exciting a vibrationally mounted, at least sectionally bar-shaped oscillating element for oscillating in the range of a resonance frequency of the oscillating element, wherein a temporally varying, in particular periodic, excitation signal is used for excitation, and wherein at least the temporal variation of the excitation signal is known or determined; —detecting a modulated oscillation of the oscillating element by means of at least one sensor, wherein the sensor supplies a sensor measurement value that varies over time as a function of an amplitude and a phase of the modulated oscillation of the oscillating element;

generating a first comparison signal by amplitude modulating a known temporally varying, in particular periodic, demodulation signal by means of the temporally varying sensor measurement variable.

Likewise, analogous to the above, the present teaching specifies a device comprising the control unit according to the present teaching, the device further comprising the at least one excitation means, wherein the control unit is connected to the at least one excitation means, the device further comprising the at least one sensor, wherein the control unit is connected to the at least one sensor, and the device comprising the oscillating element.

A wide range of excitation means known per se can be principally considered. A preferred embodiment of the device according to the present teaching specifies that the at least one excitation means comprises a piezo actuator. This ensures a particularly cost-effective and at the same time very precise option for exciting the oscillation of the oscillating element.

Alternatively or additionally, however, other excitation means known per se are conceivable, such as means for generating a magnetic field in which the oscillating element is arranged, or for example a permanent magnet or Helmholtz coils, or a magnetic sample, as well as at least one conductor path on the oscillating element that is subjected to high-frequency AC voltage, so that the forming high-frequency alternating current induces the Lorentz force to act on the oscillating element, which in turn leads to the oscillation of the oscillating element. A further example of an excitation means would be a magnetization of the oscillating element, wherein the oscillating element is excited to oscillate by a magnetic alternating field generated in the region of the oscillating element. Another example of an excitation means would be the use of electrostatic rejection or attraction, wherein the oscillating element and an object, preferably to be examined and arranged in the region of the oscillating element, are suitably subjected to electrical AC voltages in order to cause the oscillation of the oscillating element.

As already stated, various options are available for further processing of the first comparison signal. A preferred embodiment of the method according to the present teaching specifies that the first comparison signal is filtered by means of at least one element acting as a low-pass filter and thus generating a filtered first comparison signal. This can for example be achieved by means of a dedicated low-pass filter element provided for this purpose or by other downstream elements that categorically do not allow high-frequency signals to pass and thus essentially automatically act as low-pass filters. Examples of such a downstream element when using the method according to the present teaching in an atomic force microscope would for example be signal adjustment elements, a scanner control (also called a feedback controller), a scanner, an anti-aliasing filter, or a power amplifier.

Such a filtered first comparison signal is accordingly dominated by the constant component, so that the determination of the amplitude of the modulated oscillation is limited essentially to a division of the filtered first comparison signal by the known factors—where applicable, including the amplitude of the excitation signal.

As already mentioned, the method according to the present teaching is suitable for use on cantilevers, in particular on atomic force microscopes. Accordingly, a preferred embodiment of the method according to the present teaching specifies that the oscillating element is a cantilever, in particular a cantilever of an atomic force microscope. Analogously, a preferred embodiment of the device according to the present teaching specifies that the oscillating element is a cantilever, in particular a cantilever of an atomic force microscope.

As already mentioned, it is advisable to use the excitation signal or a signal derived from the excitation signal as a demodulation signal. In practice, this can be achieved with very little effort. Accordingly, a preferred embodiment of the method according to the present teaching specifies that the demodulation signal is generated by means of the excitation signal, in particular by generating the demodulation signal as a linear function of the excitation signal.

For example, precisely the excitation signal or an integer multiple (e.g., double) of the excitation signal can be used as the demodulation signal, wherein the phase of the demodulation signal, f, can be shifted in relation to the excitation signal. In particular, the phase of the demodulation signal can be adjusted, preferably automatically, to the phase of the modulated oscillation, $f_c$, so that the phase of the demodulation signal and the phase of the modulated vibration are for example the same or differ only by $\pm p/2$. In this case, the same procedure can be followed as for the known phase adjustment method for amplitude-modulated atomic force microscopy using lock-in amplifiers.

According to what is stated above, a preferred embodiment of the method according to the present teaching specifies that a phase of the demodulation signal is shifted such that $f \gg f_c$ applies or $f \gg f_c \pm p/2$.

When $f \gg f_c$ is realized, the amplitude of the modulated oscillation of the oscillating element can be determined very easily on the basis of the constant component of the first comparison signal, since the constant component in this case is independent of f and $f_c$.

On the other hand, if $f \gg f_c \pm p/2$ is realized, the constant component of the first comparison signal is essentially eliminated. This means that $f_c$ can be determined on the basis off by varying f until the constant component of the first comparison signal disappears. The latter can for example be used with regard to a phase-modulated operation of an atomic force microscope (PM-AFM) or with regard to a frequency-modulated operation of an atomic force microscope (FM-AFM).

Specifically, the setting of $f \gg f_c \pm p/2$ immediately results in $f_c$ in relation to $p\pm/2$, which is sufficient for many applications. In addition, $f_c$ can in principle also be precisely determined by distinguishing between the cases $f \gg f_c + p/2$ and $f \gg f_c - p/2$. For this purpose, a distinction is made in the variation off of the sign or the rate of change in the zero crossings of the constant component of the first comparison signal: the constant component changes on zero crossing once from positive to negative, and once from negative to positive.

As already stated, a wide variety of sensors and correspondingly different sensor measurement variables are candidates for the method according to the present teaching. A preferred embodiment of the method according to the present teaching specifies that the at least one sensor comprises a piezoresistive element, and the sensor measurement variable is the electrical resistance of the piezoresistive element. A preferred embodiment of the device according to the present teaching analogously specifies that the at least one sensor comprises a piezoresistive element, and the sensor measurement variable is the electrical resistance of the piezoresistive element. Electrical resistance is not necessarily understood to be purely ohmic resistance, but can, where appropriate, also be impedance. This is realized relatively simple in practice, whereby high measurement accuracy is also achieved.

In order to easily determine the resistance changes of the at least one piezoresistive element, a particularly preferred embodiment of the method according to the present teaching specifies that the demodulation signal is an alternating current signal and that the first comparison signal is generated by means of a voltage divider, wherein the voltage divider is formed by a first electrical resistance and a second electrical resistance and wherein the second electrical resistance comprises the electrical resistance of the piezoresistive element. A particularly preferred embodiment of the device according to the present teaching analogously specifies that a voltage divider is specified in order to generate the first comparison signal, wherein the voltage divider is formed by a first electrical resistance and a second electrical resistance and wherein the second electrical resistance comprises the electrical resistance of the piezoresistive element.

The second electrical resistance thus varies versus time according to the resistance changes versus time of the (at least one) piezoresistive element. The second resistance can consist of the electrical resistance of the (at least one) piezoresistive element. However, the second electrical resistance can also consist of a sum of electrical resistances that comprises the electrical resistance of the (at least one) piezoresistive element. This sum can, for example, be formed from the electrical resistance of the (at least one) piezoresistive element and another electrical resistance that essentially corresponds to the first electrical resistance, so that the first comparison signal fluctuates versus time around half the amplitude of the demodulation signal.

The demodulation signal or alternating current signal is applied to the voltage divider. The voltage drop at the second resistance corresponds to the demodulation signal, wherein the amplitude is modulated according to the temporally varying sensor measurement variable, i.e., according to the temporal resistance changes of the piezoresistive element. In this way, the first comparison signal is generated, which can therefore be tapped as a voltage drop at the second resistance.

The voltage drop at the first resistance of course in this case also corresponds to the demodulation signal, wherein the amplitude is modulated according to the temporally varying sensor measurement variable, i.e. by the temporal resistance changes of the piezoresistive element. Although this modulation is inverse to the modulation at the second resistance, it still represents an amplitude modulation of the demodulation signal. In other words, the voltage drop at the first resistance of the voltage divider can also be used as the first comparison signal.

As already explained, the first comparison signal comprises a constant component and a temporally varying component. It has been demonstrated that the latter can have a relatively high amplitude. If one wants to remove the temporally varying portion with a low-pass filter in such a case, it must have a relatively low limit frequency, which in turn has a limiting effect on the speed of the method or the applications of the method. For some applications, this has no practical relevance, for example for density determination of a medium surrounding the oscillating element, wherein this density generally does not vary very quickly. In other applications, it can be desirable to increase the speed, for example in order to achieve particularly high scanning speeds for atomic force microscopy.

In order to be able to better infer the amplitude or the phase of the modulated oscillation from the first comparison signal—in particular when the time resolution is important, i.e. for applications that require rapid demodulation—a preferred embodiment of the method according to the present teaching specifies that a difference signal is generated by a linear combination of the first comparison signal with a known temporally varying, in particular periodic, second comparison signal.

What was stated above regarding the excitation signal or the demodulation signal applies analogously for the second comparison signal, i.e. the second comparison signal does not necessarily have to be periodic, but could for example—apart from random deviations—be periodic or "nearly periodic", or consist of one or more pulses with a spectrum of frequencies or comprise one or more such pulses. If the second comparison signal is selected to be periodic, it does not necessarily have to be sinusoidal, but can for example also be formed by means of at least one rectangular oscillation or triangular oscillation. The decisive factor is that the temporally varying second comparison signal is known.

In particular, it is advisable to use the demodulation signal or a signal derived from the demodulation signal as the second comparison signal, e.g. by multiplying the demodulation signal.

The difference signal is obtained by linearly combining the first comparison signal to the second comparison signal, in particular by subtraction or addition of the two signals. Strictly for the sake of completeness, it is stated that the two comparison signals can also be multiplied by coefficients not equal to 1. Here and in the following, linear combination or linearly combining is to be understood in such a way that it comprises the addition of a constant term.

The difference signal also generally consists of a constant component and of a temporally varying component, wherein the amplitude of the modulated oscillation of the oscillating element appears as a proportionality factor for both components. This means that both the constant component and the amplitude of the temporally varying component of the difference signal are proportional to the amplitude of the modulated oscillation of the oscillating element, wherein the remaining factors are generally known and may include the amplitude of the excitation signal.

As with the first comparison signal, the constant component of the difference signal is generally a function of the phase of the demodulation signal and the phase of the modulated oscillation of the oscillating element, in particular a function of the addition and/or subtraction of the phase of the demodulation signal and the phase of the modulated oscillation of the oscillating element. Accordingly, what is stated above regarding the further processing of the first comparison signal applies analogously to the difference signal.

In contrast to the first comparison signal, the amplitude of the temporally varying term of the difference signal can be greatly reduced by means of the linear combination of the two comparison signals. This simplifies the further processing of the difference signal and in particular favors the use of the method according to the present teaching in applications that require very rapid demodulation. In this case, in particular, when using a low-pass filter to remove the temporally varying component of the difference signal, the low-pass filter (see also below) does not have to have a relatively low limit frequency. The more rapid demodulation for example has a positive effect when using the method according to the present teaching for atomic force microscopy, because this permits a very rapid scanner control and thus a faster examination of the sample surface.

The difference signal can be further processed completely analogously to the first comparison signal. As already stated, various options are available for further processing of the first comparison signal. A preferred embodiment of the method according to the present teaching specifies that the difference signal is filtered by means of at least one element acting as a low-pass filter and thus generating a filtered first difference signal. This can for example be achieved by means of a dedicated low-pass filter element provided for this purpose or by other downstream elements that categorically do not allow high-frequency signals to pass and thus essentially automatically act as low-pass filters. Examples of such a downstream element when using the method according to the present teaching in an atomic force microscope would for example be signal adjustment elements, a scanner control (also called a feedback controller), a scanner, an anti-aliasing filter, or a power amplifier.

Such a filtered difference signal is accordingly dominated by the constant component, so that the determination of the amplitude of the modulated oscillation is limited essentially to a division of the filtered difference signal by the known factors—where applicable, including the amplitude of the excitation signal. What was stated above applies analogously for the first comparison signal.

According to what is stated above, a preferred embodiment of the device according to the present teaching specifies that at least one low-pass filter is provided. The first comparison signal can be filtered with the at least one low-pass filter, and thus a filtered first comparison signal can be generated, or the difference signal can be filtered and thus a filtered difference signal can be generated.

As already mentioned, it is advisable to use the demodulation signal or a signal derived from the demodulation signal as the second comparison signal. In practice, this can be achieved with very little effort. Accordingly, a preferred embodiment of the method according to the present teaching specifies that the second comparison signal is generated by means of the demodulation signal, in particular by generating the second comparison signal as a linear function of the demodulation signal. For example, precisely the demodulation signal or an integer multiple (e.g., double) of the demodulation signal can be used as the second comparison signal.

As already mentioned, what is stated above regarding the first comparison signal applies analogously to the further processing of the difference signal. In other words, if $f \gg f_c$ is realized, the constant component of the difference signal can be determined very easily as described above, thus in turn permitting a simple determination of the amplitude of the modulated oscillation of the oscillating element, since the constant component is in this case independent off and G.

On the other hand, if $f \gg f_c \pm p/2$ is realized, the constant component of the difference signal is essentially eliminated. This means that $f_c$ can be determined on the basis off by varying f until the constant component of the difference signal disappears. The latter can for example be used with regard to a phase-modulated operation of an atomic force microscope (PM-AFM) or with regard to a frequency-modulated operation of an atomic force microscope (FM-AFM).

Specifically, the setting of $f \gg f_c \pm p/2$ immediately results in $f_c$ in relation to $p \pm /2$, which is sufficient for many applications. In addition, $f_c$ can in principle also be precisely determined by distinguishing between the cases $f \gg f_c + p/2$ and $f \gg f_c - p/2$. For this purpose, a distinction is made in the variation off of the signal or the rate of change in the zero crossings of the constant component of the difference signal: the constant component changes on zero crossing once from positive to negative, and once from negative to positive.

When using the voltage divider to generate the first comparison signal, the demodulation signal or the AC voltage applied to the voltage divider—or a signal derived therefrom, for example by amplification or multiplication—can be used as the second comparison signal in order to ensure a particularly simple design. Accordingly, a particularly preferred embodiment of the method according to the present teaching specifies that the second comparison signal is generated by means of a further voltage divider, which is formed from a third electrical resistance and a fourth electrical resistance, wherein the voltage divider and the further voltage divider are preferably part of a bridge circuit, and that the first comparison signal and the second comparison signal are subtracted from one another to generate the difference signal. A particularly preferred embodiment of the device according to the present teaching analogously specifies that the device comprises a further voltage divider, which is formed from a third electrical resistance and a fourth electrical resistance in order to generate a second comparison signal by means of the further voltage divider, wherein the voltage divider and the further voltage divider are preferably part of a bridge circuit.

For the sake of completeness, it is noted that the difference signal can be formed by subtracting the second comparison signal from the first comparison signal or by subtracting the first comparison signal from the second comparison signal.

An operational amplifier can for example be used to generate the difference signal or to subtract the two comparison signals from each other by feeding both comparison signals to said operational amplifier and whose output signal then is the difference signal.

In the case of a bridge circuit, the bridge circuit, more precisely the bridge branch of the bridge circuit, can be used to generate the difference signal. The difference signal thus results to a certain extent automatically in the bridge branch. An operational amplifier is typically used to amplify the signal of the bridge branch, wherein the operational amplifier can be specified in particular in the bridge branch. In this case, the difference signal is to be understood as the output signal of the operational amplifier.

The third electrical resistance and the fourth electrical resistance can in principle be selected as desired. In particular, the third electrical resistance and the fourth electrical resistance can be selected to be the same as the first electrical resistance. The first, second and third electrical resistance and, if applicable, the further electrical resistance can also be formed as a variable resistance.

As already mentioned several times, the method according to the present teaching or the device according to the present teaching is in particular suited for use in an atomic force microscope. Accordingly, a particularly preferred embodiment of the method according to the present teaching specifies that the filtered difference signal is amplified with a constant gain factor and then subtracted from a target value in order to form a control signal, wherein the control signal is fed to a scanner control in order to adjust the distance between a specimen and the cantilever. A particularly preferred embodiment of the device according to the present teaching analogously specifies that a scanner control is provided to adjust the distance between a specimen and the cantilever.

A control circuit of the atomic force microscope is thus realized. The control circuit attempts to keep the amplitude of the oscillation of the cantilever constant by adjusting the distance, and thus the force interaction, between the cantilever or the cantilever tip and the sample. This mode is in particular used for measurements under environmental conditions or also in liquids.

The scanner control is preferably connected to the control unit, wherein the connection does not have to be wired, but can for example also be realized by radio. It is also conceivable that the scanner control is integrated into the control unit.

A preferred embodiment of the method according to the present teaching specifies that the modulated oscillation of the oscillating element is further detected with a second sensor, comprising a second piezoresistive element that is essentially identical to the piezoresistive element, wherein the second sensor also supplies a sensor measurement variable that varies versus time as a function of the amplitude and the phase of the modulated oscillation of the oscillating element and wherein the sensor measurement variable of the second sensor is the electrical resistance of the second piezoresistive element, that a first phase-shifted comparison signal is generated by amplitude modulation of a known temporally varying, in particular periodic, phase-shifted demodulation signal by means of the temporally varying sensor measurement variable of the second sensor, wherein the phase-shifted demodulation signal has a defined known phase shift to the demodulation signal, that the phase-shifted demodulation signal is also an alternating current signal, wherein the first phase-shifted comparison signal is also generated by means of a voltage divider, wherein the voltage divider is formed from a first electrical resistance and a second electrical resistance and wherein the second electrical resistance comprises the electrical resistance of the second piezoresistive element, that a phase-shifted difference signal is generated by a linear combination of the first phase-shifted comparison signal with a known temporally varying, in particular periodic, second phase-shifted comparison signal, that the second phase-shifted comparison signal is generated by means of the phase-shifted demodulation signal, wherein the second comparison signal is generated by means of a further voltage divider that is formed from a third electrical resistance and a fourth electrical resistance, wherein the voltage divider and the further voltage divider are part of a bridge circuit, and wherein the first phase-shifted comparison signal and the second phase-shifted comparison signal are subtracted from one another to generate the phase shifted difference signal, that the phase-shifted difference signal is filtered by means of at least one element acting as a low-pass filter and thus generating a filtered phase-shifted difference signal.

This allows the simultaneous determination of the amplitude and the phase of the modulated oscillation by suitably mathematically combining or further processing the filtered phase shifted difference signal and the filtered difference signal. The underlying idea here is to operate the two independently, but essentially the same—that is, with the exception of unavoidable differences primarily caused by technical manufacturing reasons, which however do not generate a different electrical behavior—piezoresistive elements with known different demodulation signals in the same manner, in order to perform an analysis analogous to the well-known IQ procedure (cf. e.g. M. G. Ruppert et al., "A review of demodulation techniques for amplitude-modulation atomic force microscopy" in Beilstein Journal of Nanotechnology, vol. 8th No. 1, pp. 1407-1426, 2017). The two demodulation signals, i.e. the demodulation signal and the phase-shifted demodulation signal, in this case have a fixed, well-known phase position in relation to each other, which is in principle sufficient for the subsequent determination of the amplitude and phase of the modulated oscillation.

Both demodulation signals can therefore in particular be formed as alternating current signals, wherein the two AC voltages differ from one another at least by the known phase shift. The phase-shifted demodulation signal generated in this way can be applied to a bridge circuit like the demodulation signal in order to generate the first phase-shifted comparison signal and the second phase-shifted comparison signal. The electrical resistance of the second piezoresistive element is part of a resistance of a voltage divider of this bridge circuit. The first phase-shifted comparison signal and the second phase-shifted comparison signal can then be subtracted from one another, for example by means of an operational amplifier, in order to generate the phase-shifted difference signal, which in turn can be filtered by means of a low-pass filter or by means of an element acting as a low-pass filter, in order to generate the filtered phase-shifted difference signal.

Accordingly, a preferred embodiment of the device according to the present teaching specifies that a second sensor, comprising a second piezoresistive element essentially identical to the piezoresistive element, is planned, whose sensor measurement variable is the electrical resistance of the second piezoresistive element, that a voltage divider is provided to generate the first phase-shifted comparison signal, wherein the voltage divider is formed from a first electrical resistance and a second electrical resistance and wherein the second electrical resistance comprises the electrical resistance of the second piezoresistive element, that a further voltage divider is provided that is formed from a third electrical resistance and a fourth electrical resistance in order to generate the second phase-shifted comparison signal by means of the further voltage divider, wherein the voltage divider and the further voltage divider are part of a bridge circuit.

In order to generate the two AC voltages for the demodulation signal and the phase-shifted demodulation signal, an AC voltage source and means, in particular comprising at least one coil and/or at least one capacitor, can be provided for generating a phase shift. However, a particularly preferred embodiment of the device according to the present teaching specifies that an AC voltage source is provided to generate the demodulation signal and an AC voltage source is provided to generate the phase-shifted demodulation signal. By using two separate AC voltage sources, the demodulation signal and the phase-shifted demodulation signal can be each set or generated exactly according to the desired specifications.

A particularly preferred embodiment of the method according to the present teaching specifies that the defined known phase shift of the phase-shifted demodulation signal to the demodulation signal is 90°. This makes it possible to generate corresponding demodulation signals with particular ease, in particular by selecting the demodulation signal as a sine function and the phase-shifted demodulation signal as a cosine function.

It would, of course, be conceivable that the phase-shifted demodulation signal differs from the demodulation signal by a fixed known factor in addition to the known phase shift, which can easily be considered mathematically in further steps in order to determine the amplitude and phase of the modulated oscillation. In order to allow a particularly simple determination, however, a particularly preferred embodiment of the method according to the present teaching specifies that the phase-shifted demodulation signal is identical to the demodulation signal except for the defined known phase shift.

A particularly preferred embodiment of the method according to the present teaching specifies that the filtered difference signal and the filtered phase-shifted difference signal are processed by means of a signal processing unit in order to calculate an output amplitude and/or an output phase. The output amplitude or output phase can, but does not have to, be exactly the amplitude or phase of the modulated oscillation. Depending on the application, it may be necessary to determine the exact value of the amplitude or phase of the modulated oscillation, or it may be sufficient to determine the corresponding value, e.g., up to a constant factor. The signal processing unit can carry out the specifically desired calculation, wherein the signal processing unit is preferably programmable in order to be able to adapt the calculation to different requirements.

Accordingly, a particularly preferred embodiment of the device according to the present teaching specifies that means for generating the difference signal and the phase-shifted difference signal are provided, that a low-pass filter is provided to generate the filtered difference signal by filtering the difference signal, and that a low-pass filter is provided to generate the filtered phase-shifted difference signal by filtering the phase-shifted difference signal, and that a signal processing unit is provided to process the filtered difference signal and the filtered phase shifted difference signal and to calculate an output amplitude and/or an output phase.

A particularly simple calculation of the output amplitude or output phase results when the demodulation signal and the phase-shifted demodulation signal differ only by the phase shift and are formed as sine and cosine signals. In this case a particularly preferred embodiment of the method according to the present teaching specifies that the output amplitude is calculated according to $$A_{out}=((DIFFS\_f)^2+(DIFFS\_f)^2)^{1/2}$$

and/or the output phase according to $$f_{out}=\tan(DIFFS\_Q\_f/DIFFS\_f f),$$

wherein $A_{out}$ refers to the output amplitude, DIFFS_f refers to the filtered difference signal, DIFFS_Q_f refers to the filtered phase-shifted difference signal, $f_{out}$ refers to the output phase, and atan refers to the arc tangent.

Typically, it follows that the output phase is identical to the phase of the modulated oscillation and the output amplitude is identical to the amplitude of the modulated oscillation up to at least one known constant factor. Analogously to what is stated above, it is conceivable that the control unit is used for generating the phase-shifted demodulation signal or the first and second phase-shifted comparison signal and/or the phase-shifted difference signal and/or the filtered phase-shifted difference signal. The signal processing unit can furthermore be integrated into the control unit.

BRIEF DESCRIPTION OF THE DRAWINGS

The present teaching is now explained in more detail with reference to exemplary embodiments. The drawings are exemplary and while they are designed to illustrate the idea of the present teaching, they are in no way intended to narrow or even conclusively reproduce the idea of the present teaching.

DETAILED DESCRIPTION

Figure 1:
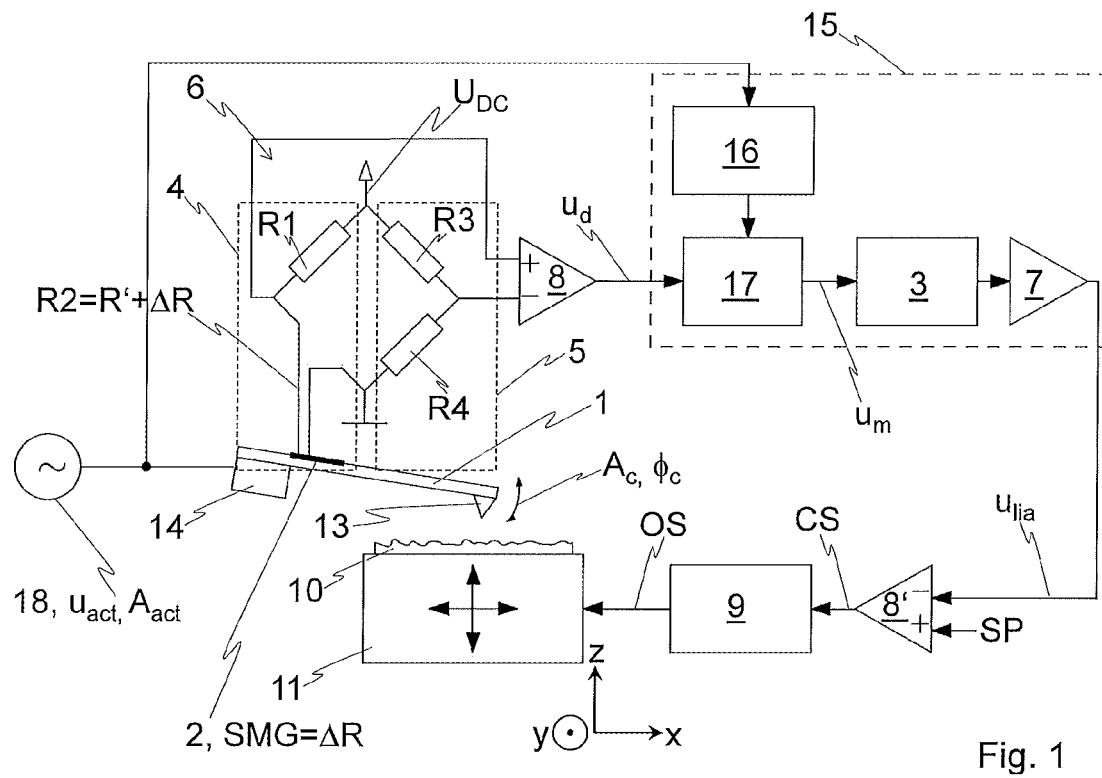
FIG. 1 illustrates a block diagram of a known method for amplitude-modulated atomic force microscopy (AM-AFM)

FIG. 1 shows a block diagram of an amplitude-modulated atomic force microscopy (AM-AFM), wherein a method according to the prior art is used for the demodulation of a modulated oscillation of an oscillating element in the form of a cantilever 1. The cantilever 1 comprises a cantilever tip 13 in order to be able to determine the topography of a sample 10 with high resolution. For this purpose, the sample 10 is placed on a scanner 11, which can move the sample 10 parallel to three mutually normal spatial directions x, y, z, wherein the two double arrows indicate shifts in the drawing plane of FIG. 1, i.e., parallel to the x and z direction.

The cantilever 1 is fastened to a piezo actuator 14, by means of which the cantilever 1 can be caused to oscillate with a frequency fin the range of a resonance frequency of the cantilever 1, i.e., the cantilever 1 is vibrationally mounted on the piezo actuator 14. For excitation, a known temporally varying excitation signal $u_{act}$ is used in the form of a periodic AC voltage with an amplitude $A_{act}$:

$$u_{act}=A_{act}*\sin(2*p*f*t),$$

wherein t is the time and the excitation signal $u_{act}$ is generated by means of an AC voltage source 18. This means that the piezo actuator 14 is operated with this excitation signal $u_{act}$. The oscillation of the cantilever 1 is modulated by the interaction with the sample 10, in particular by Van der Waals forces between the cantilever 1 or the cantilever tip 13 and the surface of the sample 10, wherein the modulation can relate to the amplitude and the phase. This means that the modulated oscillation of the cantilever 1 has an amplitude $A_c$ and a phase $f_c$, which are initially unknown.

In order to detect the modulated oscillation of the cantilever 1, a piezoresistive element 2 is provided in the exemplary embodiment of the prior art, which is integrated in or on the cantilever 1 and whose electrical resistance DR changes according to the modulated oscillations of the cantilever 1 (due to the deformation of the cantilever 1 associated with the oscillation). In other words, the electrical resistance DR of the piezoresistive element 2 represents a sensor measurement variable SMG, which varies versus time as a function of the amplitude $A_c$ and the phase $f_c$.

The piezoresistive element 2 is analyzed by means of a bridge circuit 6, wherein the bridge circuit 6 is supplied with a DC voltage $U_{DC}$. The bridge circuit 6 comprises a voltage divider 4 and a further voltage divider 5 (each indicated by a dashed line), wherein the voltage divider 4 comprises a first electrical resistance R1 and a second electrical resistance R2 and wherein the further voltage divider 5 comprises a third electrical resistance R3 and a fourth electrical resistance R4. In the exemplary embodiment shown, the second electrical resistance R2 is formed by the sum of a further electrical resistance R' and the electrical resistance DR of the piezoresistive element 2, i.e.

$$R2=R'+DR.$$

Preferably, the first electrical resistance R1, the further electrical resistance R', the third electrical resistance R3 and the fourth electrical resistance R4 are selected, or in the case of adjustable resistances are set, to equal the value R, i.e.

$$R1=R'=R3=R4=R.$$

This is assumed in the following for the exemplary embodiment shown in FIG. 1.

The modulated oscillation of the cantilever 1 leads to a temporally varying voltage differential $u_d$ on the bridge, which is output by an operational amplifier 8 in the exemplary embodiment shown and reads as follows:

$$u_d=U_{DC}*(R+DR)/(2*R+DR)-U_{DC}/2=U_{DC}*(DR)/(4*R+2*DR).$$

Using the approximation normally valid in practice $$DR<<R$$

results in:

$$u_d=U_{DC}/(4*R)*DR=U_{DC}/(4*R)*A_c*\sin(2*p*f*t+f_c).$$

In order to perform a demodulation and obtain $A_c$ or $f_c$, an elaborate and expensive lock-in amplifier 15 is provided according to the prior art, which is supplied with $u_d$. The excitation signal $u_{act}$ is also supplied to the lock-in amplifier 15 as a reference signal, wherein a phase $f_{ref}$ of the excitation signal $u_{act}$ is shifted by means of a phase shifter 16 of the lock-in amplifier 15. In particular, an adaptation of $f_{ref}$ to $f_c$ can be achieved by the phase shifter 16, i.e.

$$f_{ref} \!\!\gg\!\! f_c.$$

This adjustment can be made in a known and automated manner by exciting the cantilever 1 to oscillate, initially without a sample 10, and by varying the phase $f_{ref}$ by means of the phase shifter 16 until an output signal $u_{lia}$ at the output of the lock-in amplifier 15 is maximized.

The output signal $u_{lia}$ of the lock-in amplifier 15 is determined as follows: The phase-shifted reference signal is multiplied by a multiplier 17 of the lock-in amplifier 15 with the voltage differential $u_d$, whereby this multiplication provides a multiplied signal $u_m$. The multiplied signal $u_m$ is then filtered by means of an electronic low-pass filter 3 of the lock-in amplifier 15 and is finally amplified by means of an amplifier 7 of the lock amplifier 15, which ultimately results in the output signal $u_{lia}$.

In the exemplary embodiment of FIG. 1, the multiplied signal $u_m$ is basically (based on the above approximation DR<<R, which is always assumed here and hereinafter)

$$u_m = U_{DC}/(4*R)*A_{act}*A_c*\sin(2*p*f*t+f_c)*\sin(2*p*f*t+f_{ref})$$

and for the stated case of the adjusted phase of the reference signal $$u_m = U_{DC}/(4*R)*A_{act}*A_c*\sin^2(2*p*f*t+f_c)$$

or by converting using the trigonometric identities $$u_m = U_{DC}/(8*R)*A_{act}*A_c*(1-\cos(4*p*f*t+2*f_c)).$$

With the exception of the known factors $U_{DC}$, R and $A_{act}$, $A_c$ thus results in a constant component of $u_m$. The high-frequency portion of $u_m$ containing $f_c$ is cut off by using the electronic low-pass filter 3. Since the amplification of the amplifier 7 is known, it is therefore possible to in principle directly infer $A_c$ from the output signal $u_{lia}$, or the output signal $u_{lia}$ represents the amplitude Ae of the modulated oscillation of the cantilever 1 except for the aforementioned known factors.

For the AM-AFM, the numerical value of $A_c$ is not typically evaluated per se, but $u_{lia}$ is compared to a target value SP by means of an operational amplifier 8', wherein the target value SP is determined or defined in a known and preferably automated manner. For this purpose, the amplitude $A_c$ or $u_{lia}$ is monitored as the cantilever 2 approaches the sample 10. If the value of the amplitude $A_c$ and/or $u_{lia}$ decreases by a given percentage within a given time, the then available value of $u_{lia}$ is used as the target value SP.

The operational amplifier 8' thus generates a control signal CS that is fed to a scanner control 9, which adjusts or regulates the distance (measured in the z-direction in FIG. 1) between the sample 10 and the cantilever 1 or the cantilever tip 13 by means of the control signal CS. A corresponding output signal OS of the scanner control unit 9, on the basis of which the scanner 11 performs the movement of the sample 10—basically parallel to all three spatial directions x, y, z-, therefore corresponds to the topography to be determined of the sample 10.

Figure 2:
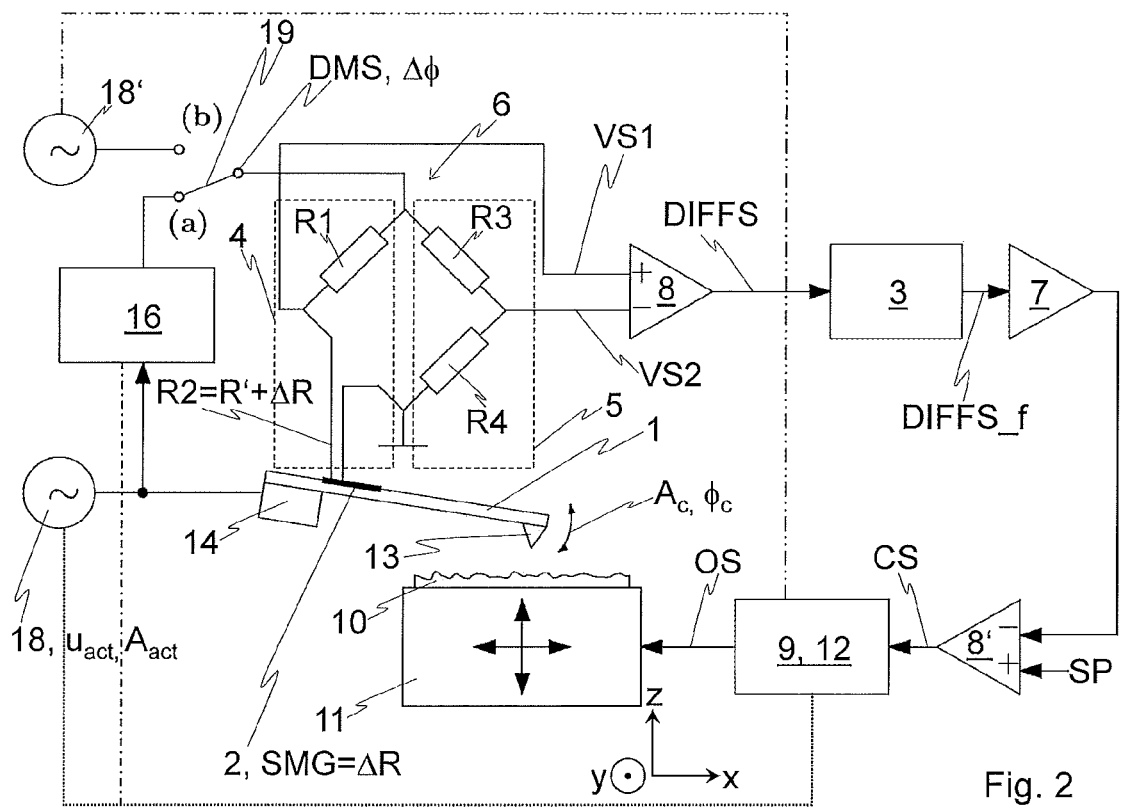
FIG. 2 illustrates a block diagram of the use of two possible embodiments of a method according to the present teaching for AM-AFM

In a block diagram analogous to FIG. 1, FIG. 2 shows the application of two embodiments of a method according to the present teaching for amplitude-modulated atomic force microscopy, whereby the latter can be operated much more easily and cost-effectively, in particular without a complex and expensive lock-in amplifier 15. The cantilever 1 including the cantilever tip 13 is again excited by means of the piezo actuator 14 to oscillate with the frequency fin the range of a resonance frequency of the cantilever 1. For this purpose, the excitation signal $u_{act}$ is generated by means of the voltage source 18, as described above for the known exemplary embodiment of FIG. 1.

The piezoresistive element 2 in turn comprises the temporally varying electrical resistance DR as a sensor measurement variable SMG, which together with the further electrical resistance R' forms the second electrical resistance R2 of the voltage divider 4 of the bridge circuit 6, also as described above.

However, the bridge circuit 6 is not operated with the DC voltage $U_{DC}$, but with a known temporally varying demodulation signal DMS in the form of an AC voltage. FIG. 2 shows two variants (marked with (a) and (b) in FIG. 2) for generating the demodulation signal DMS, between which can be toggled by means of a switch 19.

In variant (a), the excitation signal $u_{act}$ of the AC voltage source 18 is used as the demodulation signal DMS, so that in this case the demodulation signal DMS is a linear function of the excitation signal $u_{act}$. A phase f of the demodulation signal DMS can be adjusted by means of a phase shifter 16 upstream of the switch 19.

In variant (b), a separate AC voltage source 18' is provided for generating the demodulation signal DMS. In particular, the phase of the f demodulation signal DMS can be set with the AC voltage source 18'. Furthermore, it is of course also possible to generate the demodulation signals DMS with the AC voltage source 18' in such a way that it corresponds to the excitation signal $u_{act}$, excluding the phase f.

Due to the temporal changes of DR or R2, the demodulation signal DMS is amplitude-modulated in the voltage divider 4, generating a first comparison signal VS1. A second comparison signal VS2 is generated in the exemplary embodiments of FIG. 2 in the further voltage divider 5 by means of the demodulation signal DMS, wherein the second comparison signal VS2 is proportional to the demodulation signal DMS and thus is a linear function of the demodulation signal DMS—and in the case of the variant (a) also of the excitation signal $u_{act}$.

The two comparison signals VS1, VS2 are then subtracted from each other using the bridge circuit 6 in order to generate a difference signal DIFFS, wherein the difference signal DIFFS is to a certain extent automatically generated in the bridge branch of the bridge circuit 6 and is present in the illustrated design examples as an output signal of the operational amplifier 8, which is arranged or switched in the bridge branch of the bridge circuit 6.

The phase f of the demodulation signal DMS can in particular be set such that $$f \!\!\gg\!\! f_c$$

applies, wherein this occurs analogously to what is described above in connection with FIG. 1. For this purpose, it is sufficient to vary the phase f of the demodulation signal DMS without sample 10, preferably automatically, until the constant component of the difference signal DIFFS is maximized.

In this case, $$R1 = R' = R3 = R4 = R$$

results in the following difference signal DIFFS completely analogous to the above statements regarding the multiplied signal $u_m$:

$$\text{DIFFS} = 1/(4*R)*A_{act}*A_c*\sin^2(2*p*f*t+f_c) = 1/(8*R)*A_{act}*A_c*(1-\cos(4*p*f*t+2*f_c)).$$

In other words, the amplitude $A_c$ of the modulated oscillation of the cantilever 1 results directly from the constant component of the difference signal DIFFS, since R and $A_{act}$ are known. In the exemplary embodiments shown in FIG. 2, the temporally varying portion of DIFFS is cut off by using the electronic low-pass filter 3 and the filtered difference signal DIFFS_f is obtained, which can be amplified with the amplifier 7 for reasons related to more practical handling.

It should be noted that an electronic low-pass filter 3 is not necessary by many practical applications since downstream elements often have a low-pass characteristic, so that the same effect is essentially achieved as with the electronic low-pass filter 3, i.e., the filtered difference signal DIFFS_f is generated.

In the exemplary embodiments of FIG. 2, the filtered difference signal DIFFS_f is compared after its amplification with the target value SP by means of the operational amplifier 8', wherein the target value SP is determined or defined in a per se known and preferably automated manner, as already explained in detail in FIG. 1. The operational amplifier 8' thus generates a control signal CS that is fed to a scanner control 9, which adjusts or regulates the distance (measured in the z-direction in FIG. 1) between the sample 10 and the cantilever 1 or the cantilever tip 13 by means of the control signal CS. The corresponding output signal OS of the scanner control unit 9, on the basis of which the scanner 11 performs the movement of the sample 10—basically parallel to all three spatial directions x, y, z—therefore again corresponds to the topography to be determined of the sample 10.

In the exemplary embodiments of FIG. 2, a control unit 12, which is formed to execute the method according to the present teaching, is integrated into the scanner control 9. The control unit 12 is connected to the AC voltage source 18 (indicated by the dotted line in FIG. 2) in order to control the latter, wherein the control unit 12 is of course also indirectly connected to the piezo actuator 14. The control unit 12 is also indirectly connected to the piezoresistive element 2 by the bridge circuit 6 and the downstream elements (operational amplifier 8, electronic low-pass filter 3, amplifier 7, operational amplifier 8').

Furthermore, in the variant (a), the electronic control unit 12 is preferably connected to the phase shifter (16) (indicated by the dashed-dotted line in FIG. 2) in order to be able to adjust the phase f of the demodulation signal DMS.

Furthermore, in the variant (b), the electronic control unit 12 is preferably connected to the AC voltage source 18' (indicated by the dashed-dotted line with two dots between the dashes in FIG. 2) in order to be able to adjust the demodulation signal DMS and in particular the phase f of the demodulation signal DMS.

It is also conceivable that the operational amplifier 8 and/or the electronic low-pass filter 3 and/or the amplifier 7 and/or the operational amplifier 8' and/or parts of the bridge circuit 6—e.g. R1, R', R3 and R4—can be integrated into the control unit 12.

It should be emphasized that the method according to the present teaching can for example also be used for other dynamic operating modes of an atomic force microscope. In the exemplary embodiments of FIG. 2 described above, the following applies for general phases f and $f_c$ using the trigonometric identities:

DIFFS=1/(4*R)*$A_{act}$*$A_c$*sin(2*p*f*t+$f_c$)*sin(2*p*f*t+f)=1/(8*R)*$A_{act}$*$A_c$*(cos($f_c$-f)-cos(4*p*f*t+$f_c$+f)).

By now setting the phase f of the demodulation signal DMS such that $$f \vartriangleright f_c \pm p/2$$

applies, the first cos-Term, which is constant and thus determines the constant component of DIFFS, disappears. Such an adjustment is in turn possible, preferably automated, by varying f until the constant component of DIFFS disappears.

However, this means that the phase f of the demodulation signal DMS can be used to determine the phase $f_c$ of the modulated oscillation of the cantilever 1, since the described setting $f_c$ is known relative to p±/2.

Accordingly, phase-modulated atomic force microscopy (PM-AFM) or frequency-modulated atomic force microscopy (FM-AFM) can also be operated using the method according to the present teaching, whose modes require the measurement of $f_c$.

Figure 3:
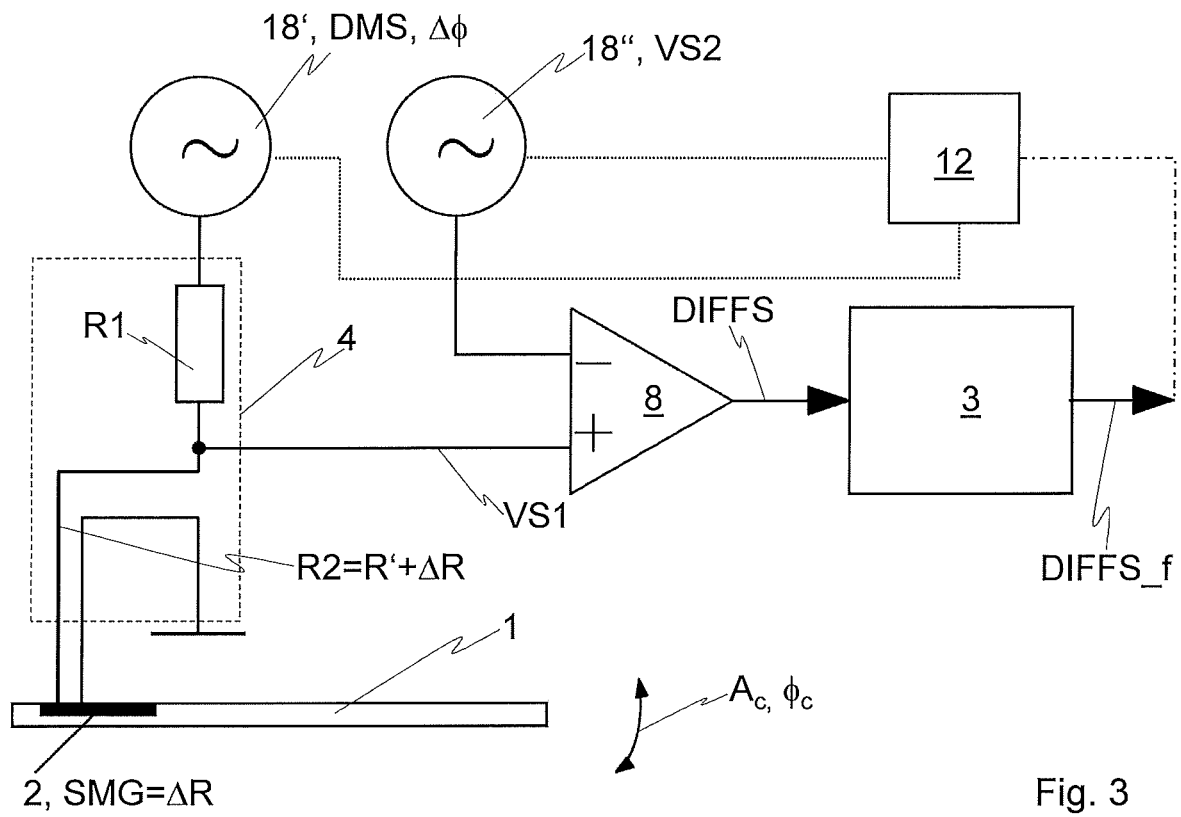
FIG. 3 illustrates a block diagram of a simplified design for executing a further embodiment of the method according to the present teaching

FIG. 3 shows an example of a design for executing a simplified embodiment of the method according to the present teaching, which is used according to FIG. 3 for demodulating the oscillations of an oscillating element embodied as a cantilever 1. For reasons of clarity, no excitation means are drawn in and no downstream elements for processing the difference signal DIFFS are shown apart from the electronic low-pass filter 3.

The embodiment of FIG. 3 does not use a bridge circuit 6, but only the voltage divider 4 for generating the first comparison signal VS1. The voltage divider 4 is operated with the (known) demodulation signal DMS, which is designed as an AC voltage by means of the AC voltage source 18'. The phase of the demodulation signal DMS is also determined or the phase f of the demodulation signal DMS can be set accordingly by means f of the AC voltage source 18'. Since the second electrical resistance R2 of the voltage divider 4 is composed of the additional electrical resistance R' and the electrical resistance DR of the piezoresistive element 2, which is integrated in or on the cantilever 1, the amplitude of the demodulation signal DMS is modulated by the sensor measurement variable SMG temporally varying due to the oscillation of the cantilever 1 or by the temporally varying electrical resistance DR. The first comparison signal VS1 is tapped as a corresponding partial voltage at the voltage divider 4 and compared by means of the operational amplifier 8 to the (known) second comparison signal VS2.

In the exemplary embodiment of FIG. 3, the second comparison signal VS2 is generated by means of an AC voltage source 18", thus ensuring that VS2 is known. The second comparison signal VS2 can be generated as a linear function of the demodulation signal DMS, in particular in the same way as the demodulation signal DMS.

In the exemplary embodiment of FIG. 3, the control unit 12 is connected to the AC voltage sources 18', 18" in order to ensure a suitable generation of the known demodulation signal DMS and the known comparison signal VS2.

In particular, the phase of the demodulation signal DMS can then be adjusted by means f of the control unit 12 such that $$f \vartriangleright f_c$$

applies. As already described above in FIG. 2, this concrete, preferably automated, method for setting the phase f of the demodulation signal DMS involves varying f without sample 10 until the constant component of DIFFS or, if applicable, of DIFFS_f is maximized.

The amplitude $A_c$ of the modulated oscillation of the cantilever 1 again is proportional to the constant component of the difference signal DIFFS. The high frequency component of the difference signal DIFFS contains the phase $f_c$ of the modulated oscillation of the cantilever 1. By low-pass filtering the difference signal DIFFS, its constant component remains, which does not contain the phase $f_c$ of the modulated oscillation of the cantilever 1. This means that the filtered difference signal DIFFS_f can be used for controlling the amplitude-modulated atomic force microscopy, analogous to the case of the embodiments described above according to FIG. 2.

Likewise analogous to the exemplary embodiments of FIG. 2, the phase of the demodulation signal DMS can be adjusted, preferably automated, by means f of the control unit 12 such that $$f \flat f_c \pm p/2$$

applies. This is done by varying f until the constant component of DIFFS disappears, whereby $f_c$ relative to p±/2 is also determined directly. In other words, the embodiment of the method according to the present teaching according to the simplified design of FIG. 3 is also suitable, among other things, for use in phase-modulated atomic force microscopy or frequency-modulated atomic force microscopy.

The dashed-dotted line in FIG. 3 indicates that the control unit 12 can be connected to one or more elements downstream of the electronic low-pass filter 3, so that an indirect connection between the control unit 12 and the piezoresistive element 2 is given.

Figure 4:
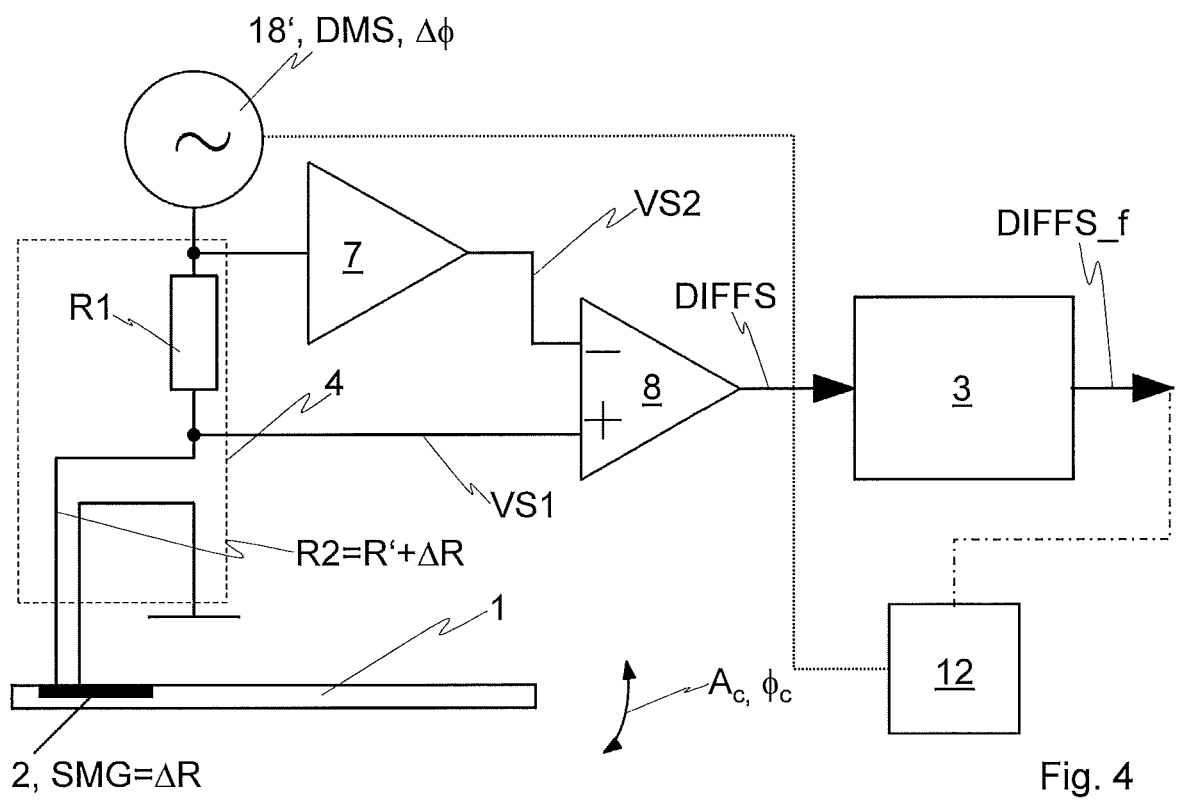
FIG. 4 illustrates a block diagram of a further simplified design for executing a further embodiment of the method according to the present teaching

FIG. 4 shows a block diagram of a further simplified design for executing a further embodiment of the method according to the present teaching. This structure differs from that of FIG. 3 only in that no separate AC voltage source 18" is used to generate the second comparison signal VS2, but rather the demodulation signal DMS generated by means of the AC voltage source 18'. Specifically, the demodulation signal DMS is tapped at the input of the voltage divider 4 and amplified by means of the amplifier 7 in order to generate the second comparison signal VS2. The control unit 12 is accordingly connected to the AC voltage source 18' in order to appropriately control the latter and to be able to adjust the demodulation signal DMS, in particular its f phase, as desired.

What is stated above regarding FIG. 3 otherwise also applies to FIG. 4. This means that the two comparison signals VS1, VS2 are subtracted from one another by means of the operational amplifier 8 in order to generate the difference signal DIFFS.

If the phase f of the demodulation signal DMS is set, preferably automated, such that $$f \flat f_c$$

applies, the amplitude $A_c$ of the modulated oscillation of the cantilever 1 is proportional to the constant component of the difference signal DIFFS. The high frequency component of the difference signal DIFFS contains the phase $f_c$ of the modulated oscillation of the cantilever 1. By low-pass filtering the difference signal DIFFS, its constant component remains, which does not contain the phase $f_c$ of the modulated oscillation of the cantilever 1. This means that the filtered difference signal DIFFS_f can be used for controlling the amplitude-modulated atomic force microscopy, analogous to the case of the embodiments described above according to FIG. 2.

If the phase f of the demodulation signal DMS is set, preferably automated, such that $$f \flat f_c \pm p/2$$

applies, the constant component of DIFFS will disappear and is thus f determined up to p±/2. In other words, the embodiment of the method according to the present teaching according to the simplified design of FIG. 4 is also suitable, among other things, for use in phase-modulated atomic force microscopy or frequency-modulated atomic force microscopy.

The dashed-dotted line in FIG. 4 indicates that the control unit 12 can be connected to one or more elements downstream of the electronic low-pass filter 3, so that an indirect connection between the control unit 12 and the piezoresistive element 2 is given.

Regarding the exemplary embodiments of FIG. 3 and FIG. 4, it should be noted that a separate electronic low-pass filter 3 does not necessarily have to be provided for low-pass filtering, since other elements downstream of the difference signal DIFFS can have a low-pass characteristic. In such cases, a low-pass filtering of the difference signal DIFFS occurs to a certain extent automatically. Examples of such a downstream element would be, for example, signal adjustment elements, the scanner controller 9 (also called feedback controller), the scanner 11, anti-aliasing filter, or a power amplifier.

Figure 5:
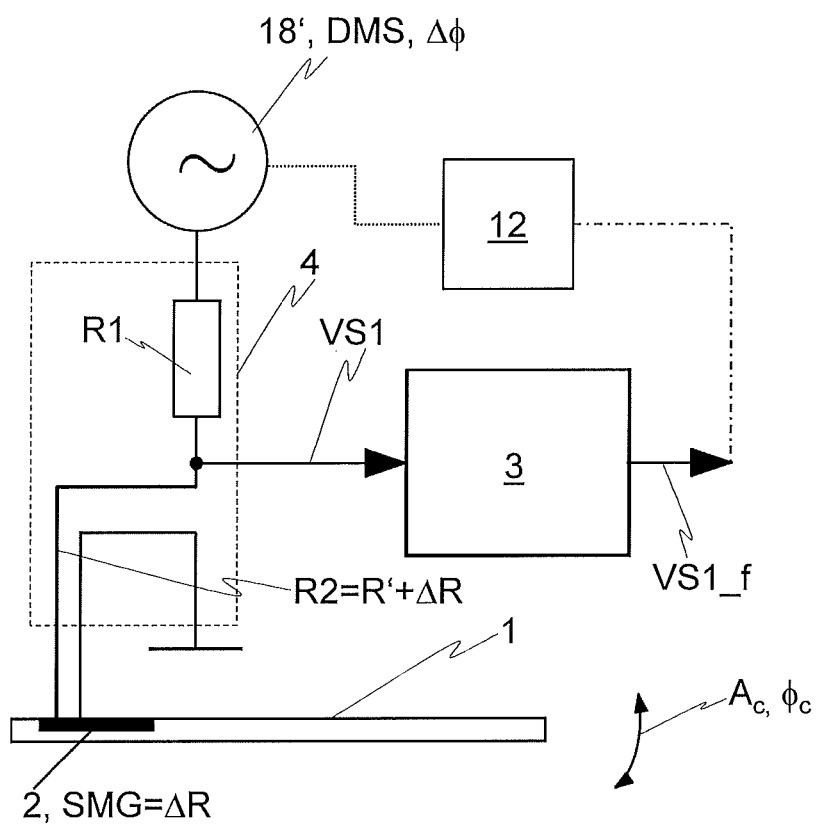
FIG. 5 illustrates a block diagram of a minimalistic design for executing a further embodiment of the method according to the present teaching

FIG. 5 shows an example of a minimal design for executing a simplified or "minimal" embodiment of the method according to the present teaching, which is used according to FIG. 5 for demodulating the oscillations of an oscillating element embodied as a cantilever 1.

The method, which is realized by way of example with the design according to FIG. 5, is essentially limited to the core of the present teaching, according to which the first comparison signal VS1, in particular the constant component of the first comparison signal VS1, is already proportional to the amplitude of the modulated oscillation $A_c$ or directly dependent on the phase $f_c$ of the modulated oscillation. In other words, the first comparison signal VS1 basically already provides the desired information about the amplitude $A_c$ or phase $f_c$ of the modulated oscillation, wherein the information about the ratio (instead of the exact numerical value) of the temporally varying amplitude $A_c$ of the modulated oscillation is sufficient for many applications.

For reasons of clarity, no excitation means are shown in FIG. 5 either and no downstream elements are shown apart from the electronic low-pass filter 3 (in this case for processing the first comparison signal VS1).

The embodiment of FIG. 5 only uses the voltage divider 4 for generating the first comparison signal VS1. The voltage divider 4 is operated with the (known) demodulation signal DMS, which is designed as an AC voltage by means of the AC voltage source 18'. The phase of the demodulation signal DMS is also determined or the phase f of the demodulation signal DMS can be set accordingly by means f of the AC voltage source 18'. Since the second electrical resistance R2 of the voltage divider 4 is composed of the additional electrical resistance R' and the electrical resistance DR of the piezoresistive element 2, which is integrated in or on the cantilever 1, the amplitude of the demodulation signal DMS is modulated by the sensor measurement variable SMG temporally varying due to the oscillation of the cantilever 1 or by the temporally varying electrical resistance DR. The first comparison signal VS1 is tapped at the voltage divider 4 as a corresponding partial voltage.

The first comparison signal VS1 has a constant component and a temporally varying component, the latter having a relatively high amplitude (half amplitude of the demodulation signal DMS for R1=R'=R). Since there is no linear combination with a second comparison signal VS2, this amplitude of the temporally varying component is also not further reduced.

In order to in this case remove the temporally varying portion with the low-pass filter 3 and thus generate a filtered first comparison signal VS1_f, the low-pass filter 3 must have a relatively low limit frequency, which in turn restricts the speed of the method or the applications of the method. In other words, the illustrated exemplary embodiment of FIG. 5 results in a limitation of the achievable scan speed when the method according to the present teaching is used for atomic force microscopy. This does not necessarily have to be disruptive, in particular depending on the sample 10 to be examined.

In the exemplary embodiment of FIG. 5, the control unit 12 is connected to the AC voltage source 18' in order to ensure a suitable generation of the known demodulation signal DMS.

In particular, the phase of the demodulation signal DMS can then be adjusted by means f of the control unit 12 such that $$f \gg f_c$$

applies. Analogous to the description above in FIG. 2, this concrete, preferably automated, method for setting the phase f of the demodulation signal DMS involves varying f without sample 10 until the constant component of VS1 or, if applicable, of VS1_f is maximized.

The amplitude $A_c$ of the modulated oscillation of the cantilever 1 is proportional to the constant component of the comparison signal VS1. The temporally varying component of the first comparison signal VS1 contains the phase $f_c$ of the modulated oscillation of the cantilever 1. As already mentioned above, by low-pass filtering the first comparison signal VS1, its constant component remains, which does not contain the phase $f_c$ of the modulated oscillation of the cantilever 1. In other words, the filtered first comparison signal VS1_f can in principle be used for controlling amplitude-modulated atomic force microscopy, analogous to the case of the embodiments described above according to FIG. 2.

Likewise analogous to the exemplary embodiments of FIG. 2, the phase f of the demodulation signal DMS can be adjusted, preferably automated, by means of the control unit 12 such that $$f \gg f_c \pm p/2$$

applies. This is done by varying f until the constant component of VS1 disappears, whereby $f_c$ relative to p±/2 is also determined directly. In other words, the embodiment of the method according to the present teaching according to the minimal design of FIG. 5 is also suitable, among other things, for use in phase-modulated atomic force microscopy or frequency-modulated atomic force microscopy.

The dashed-dotted line in FIG. 5 indicates that the control unit 12 can be connected to one or more elements downstream of the electronic low-pass filter 3, so that an indirect connection between the control unit 12 and the piezoresistive element 2 is given.

Finally, for the exemplary embodiment of FIG. 5, it should be noted that a separate electronic low-pass filter 3 does not necessarily have to be provided for low-pass filtering, since other elements downstream of the first comparison signal VS1 can have a suitable low-pass characteristic. In such cases, a low pass filtering of the first comparison signal VS1 occurs to a certain extent automatically. Examples of such a downstream element would be, for example, signal adjustment elements, the scanner controller 9 (also called feedback controller), the scanner 11, anti-aliasing filter, or a power amplifier.

Figure 6:
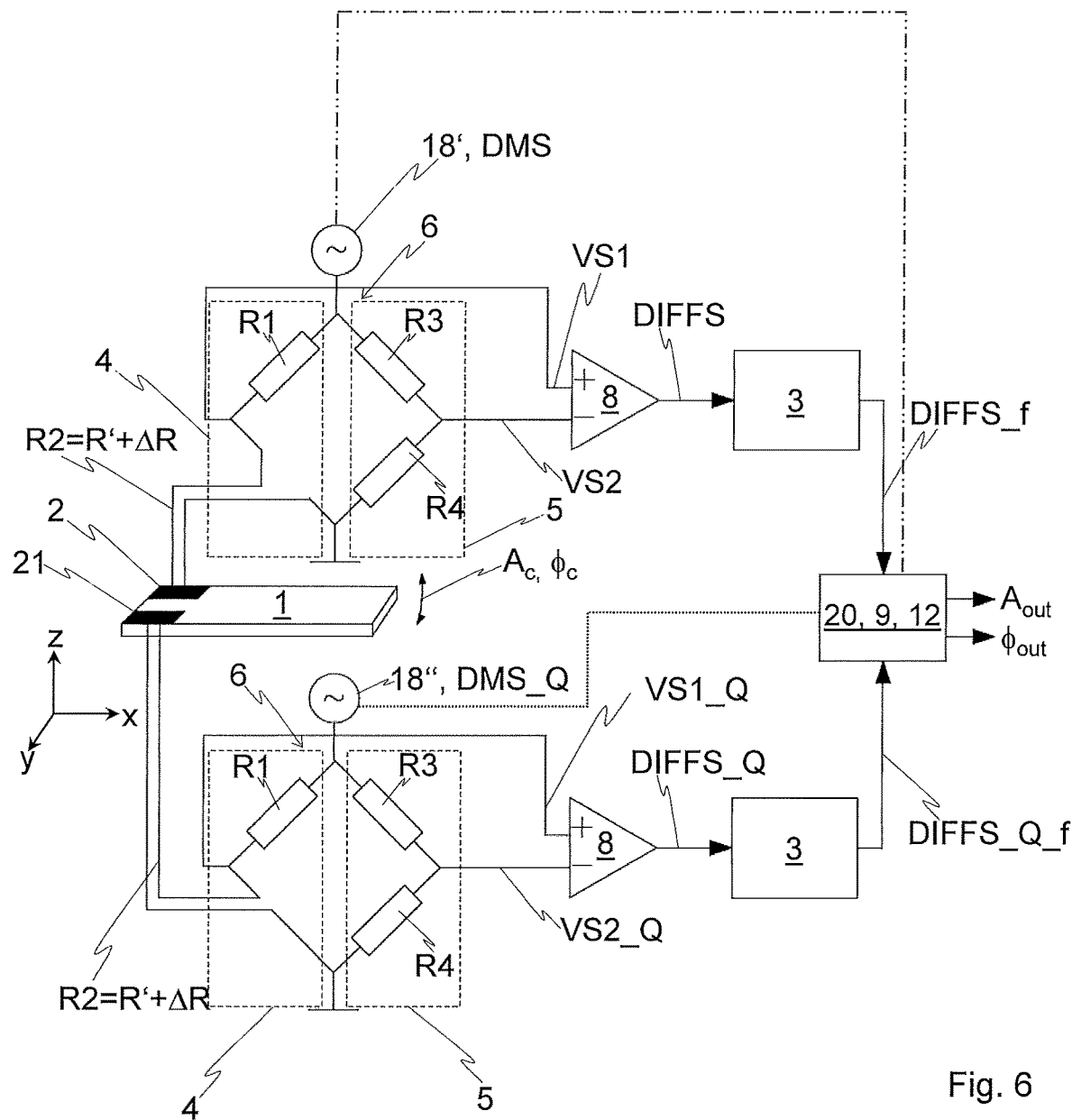
FIG. 6 illustrates a block diagram of a design for executing a further embodiment of the method according to the present teaching

For reasons of clarity, FIG. 6 shows a simplified diagram (in particular without cantilever tip 13, piezo actuator 14 and the voltage source for generating the excitation signal $u_{act}$) of an embodiment variant that allows the simultaneous determination of the amplitude $A_c$ and the phase $f_c$ of the modulated oscillation. In this case, the piezoresistive element 2 and a second piezoresistive element 21 are provided on the oscillating element or cantilever 1 for the purpose of detecting its oscillation, wherein the two piezoresistive elements 2, 21 are substantially the same.

As in the exemplary embodiments of FIG. 2, the electrical resistance DR of the piezoresistive element 2 is part of the second electrical resistance R2 of the bridge circuit 6, which is operated with the demodulation signal DMS in the form of an AC voltage. The demodulation signal DMS is generated with an AC voltage source 18', whereby otherwise the above-mentioned applies analogously to FIG. 2. Accordingly, the filtered difference signal DIFFS_f is generated by means of the piezoresistive element 2, the bridge circuit 6, the operational amplifier 8 and the low pass filter 3.

Like the piezoresistive element 2, the second piezoresistive element 21 comprises the electrical resistance DR that varies versus time according to the modulated oscillation as the sensor measurement variable SMG and is connected analogously to the piezoresistive element 2. In other words, the electrical resistance DR of the second piezoresistive element 21 together with a further electrical resistance R' forms a second electrical resistance R2 of a voltage divider 4 of a bridge circuit 6. This voltage divider 4 further comprises a first electrical resistance R1. The bridge circuit 6 comprises a further voltage divider 5, which is formed from a third electrical resistance R3 and a fourth electrical resistance R4 (the voltage dividers 4, 5 are indicated in FIG. 6 by dashed lines). This bridge circuit 6 is operated with a phase-shifted demodulation signal DMS_Q. In the exemplary embodiment shown, the phase-shifted demodulation signal DMS_Q is identical to the demodulation signal DMS except for a phase shift of 90° and is generated by means of the AC voltage source 18".

Correspondingly, in the bridge circuit 6 operated with the phase-shifted demodulation signal DMS_Q the phase-shifted demodulation signal DMS_Q is amplitude modulated due to the temporal variation of DR of the second piezoresistive element 21, as a result of which a first phase-shifted comparison signal VS1_Q is generated, which is generated by means of the voltage divider 4 and is tapped between the resistors R1 R2. Similarly, a second phase-shifted comparison signal VS2_Q is generated by means of the phase-shifted demodulation signal DMS_Q, which is generated by means of the further voltage divider 5 and is tapped between the resistors R3 and R4. This means that the second phase-shifted comparison signal VS2_Q is a linear function of, and proportional to, the phase-shifted demodulation signal DMS_Q.

The two phase-shifted comparison signals VS1_Q, VS2_Q are then subtracted from each other using the bridge circuit 6 in order to generate a phase-shifted difference signal DIFFS_Q, wherein the phase-shifted difference signal DIFFS_Q is to a certain extent automatically generated in the bridge branch of the bridge circuit 6 and is present in the illustrated design examples as an output signal of the operational amplifier 8, which is arranged or switched in the bridge branch of the bridge circuit 6.

An electronic low-pass filter 3, which accordingly outputs a filtered phase-shifted difference signal DIFFS_Q_f, is connected downstream of this operational amplifier 8.

The filtered phase-shifted difference signal DIFFS_Q_f and the filtered difference signal DIFFS_f are fed to a signal processing unit 20, which is integrated into the control unit 12 in the illustrated exemplary embodiment, as is the scanner control 9. The signal processing unit 20 calculates an output amplitude $A_{out}$ and/or an output phase $f_{out}$ based on the signals DIFFS_Q_f and DIFFS_f.

The control unit 12 is also indirectly connected to the piezoresistive element 2 by the bridge circuit 6 and the respective downstream elements (operational amplifier 8 and electronic low-pass filter 3). The dashed dotted line in FIG. 6 indicates the connection of the control unit 12 to the AC voltage source 18', so that the control unit 12 can control the AC voltage source 18' in order to adjust the demodulation signal DMS. The dotted line in FIG. 6 indicates the connection of the control unit 12 to the AC voltage source 18", so that the control unit 12 can control the AC voltage source 18" in order to adjust the demodulation signal DMS_Q.

In order to illustrate the ability to simultaneously determine $A_c$ and $f_c$, the following is a concrete example for executing the method according to the present teaching by means of a design according to FIG. 6. In this case as well, the cantilever 1 is operated with the frequency f by means of a sinusoidal AC voltage (using a piezo actuator not shown in FIG. 6). The oscillation of the cantilever 1 thus results in the following electrical resistance DR in both piezoresistive elements 2, 21:

$$DR = A_c * \sin(2*p*f*t + f_c).$$

The following demodulation signal DMS is generated with the AC voltage source 18':

$$DMS = A_{DMS} * \sin(2*p*f*t),$$

wherein $A_{DMS}$ is the Amplitude of this AC Voltage.

The following phase-shifted demodulation signal DMS_Q is generated with the AC voltage source 18", which has a phase shift of 90° compared to the demodulation signal DMS:

$$DMS\_Q = A_{DMS} * \cos(2*p*f*t).$$

This means that the phase-shifted demodulation signal DMS_Q and the demodulation signal DMS have the same amplitude $A_{DMS}$.

Analogous to the explanations above, $$R1 = R' = R3 = R4 = R$$

results in the following difference signal DIFFS:

$$DIFFS \approx DMS*DR/(4*R) = 1/(4*R)*A_{DMS}*A_c*\sin(2*p*f*t)*\sin(2*p*f*t+f_c) = 1/(8*R)*A_{DMS}*A_c*(\cos(f_c) - \cos(4*p*f*t+f_c)).$$

For the phase-shifted difference signal DIFFS_Q results analogously:

$$DIFFS\_Q \approx DMS\_Q*DR/(4*R) = 1/(4*R)*A_{DMS}*A_c*\cos(2*p*N)*\sin(2*p*f*t+f_c) = 1/(8*R)*A_{DMS}*A_c*(\sin(f_c) + \sin(4*p*f*t+f_c)).$$

The high-frequency components are removed by the low-pass filters 3, so that the filtered difference signal DIFFS_f and the filtered phase-shifted difference signal DIFFS_Q_f are obtained in the form of the following DC voltages:

$$DIFFS\_f = 1/(8*R)*A_{DMS}*A_c*\cos(f_c)$$

and $$DIFFS\_Q\_f = 1/(8*R)*A_{DMS}*A_c*\sin(f_c).$$

These signals DIFFS_f and DIFFS_Q_f can be processed in the signal processing unit 20 by means of simple mathematical operations in order to determine the output amplitude $A_{out}$ and the output phase $f_{out}$. For example, the following output amplitude $A_{out}$ can be calculated:

$$A_{out} = ((DIFFS\_f)^2 + (DIFFS\_Q\_f)^2)^{1/2} = ((1/(8*R)*A_{DMS}*A_c)^2*(\cos^2(f_c) + \sin^2(f_c)))^{1/2} = 1/(8*R)*A_{DMS}*A_c.$$

Since R and $A_{DMS}$ are known, the exact numerical value of the amplitude $A_c$ of the modulated oscillation can be determined immediately from the output amplitude $A_{out}$. If the exact numerical value of the amplitude $A_c$ of the modulated oscillation is not important and a value proportional to $A_c$ is sufficient, the output amplitude $A_{out}$ can continue to be used. For example, the output amplitude $A_{out}$ can be used for feeding into the scanner control 9, possibly amplified and/or after prior comparison with a target value SP, analogously as stated above in the description of the exemplary embodiments of FIG. 2.

Furthermore, the following output phase $f_{out}$ can be calculated, wherein atan refers to the arc tangent and tan refers to the tangent:

$$f_{out} = \text{atan}(DIFFS\_Q\_f/DIFFS\_f) = \text{atan}(\sin(f_c)/\cos(f_c)) = \text{atan}(\tan(f_c)) = f_c.$$

This means that this calculation of the output phase $f_{out}$ directly results in the exact numerical value of the phase $f_c$ of the modulated oscillation.

Thus, the amplitude $A_c$ of the modulated oscillation and the phase $f_c$ of the modulated oscillation can be determined at the same time without an adjustment of the phase of the demodulation signal DMS being necessary, as would be necessary in the exemplary embodiments of FIG. 2.

The invention claimed is:

1. A method for demodulation comprising the steps of:
   exciting a vibrationally mounted, at least sectionally bar-shaped oscillating element for oscillating in the range of a resonance frequency of the oscillating element, wherein a temporally varying excitation signal is used for excitation, and wherein at least the temporal variation of the excitation signal is known or determined;
   detecting a modulated oscillation of the oscillating element by at least one sensor, wherein the sensor supplies a sensor measurement variable that varies over time as a function of an amplitude and a phase of the modulated oscillation of the oscillating element; wherein the method comprises the following:
   generating a first comparison signal by amplitude modulating a known temporally varying demodulation signal by the temporally varying sensor measurement variable;
   wherein the at least one sensor comprising a piezoresistive element and the sensor measurement variable is the electrical resistance of the piezoresistive element;

wherein the demodulation signal is an AC voltage signal and that the first comparison signal is generated by a voltage divider;

wherein the voltage divider is formed from a first electrical resistance and a second electrical resistance, and wherein the second electrical resistance comprises the electrical resistance of the piezoresistive element;

wherein a difference signal is generated by a linear combination of the first comparison signal with a known temporally varying second comparison signal;

wherein the difference signal is filtered by at least one element acting as a low-pass filter, thus generating a filtered difference signal, wherein the second comparison signal is generated by a further voltage divider, which is formed from a third electrical resistance and a fourth electrical resistance;

wherein the voltage divider and the further voltage divider are preferably part of a bridge circuit, and in that the first comparison signal and the second comparison signal are subtracted from one another to generate the difference signal;

wherein a difference signal is generated by a linear combination of the first comparison signal with a known temporally varying second comparison signal;

wherein the difference signal is filtered by at least one element acting as a low-pass filter, thus generating a filtered difference signal, wherein the second comparison signal is generated using the demodulation signal;

wherein the modulated oscillation of the oscillating element is additionally detected with a second sensor, including a second piezoresistive element essentially identical to the piezoresistive element;

wherein the second sensor also supplies a sensor measurement variable that varies versus time as a function of the amplitude and the phase of the modulated oscillation of the oscillating element and wherein the senor measurement variable of the second sensor is the electrical resistance of the second piezoresistive element, in that a first phase-shifted comparison signal is generated by amplitude modulating a known temporally varying phase-shifted demodulation signal by the temporally varying sensor measurement variable of the second sensor;

wherein the phase-shifted demodulation signal has a defined known phase shift in relation to the demodulation signal, in that the phase-shifted demodulation signal is also an AC voltage signal;

wherein the first phase-shifted comparison signal is also generated by a voltage divider, wherein the voltage divider is formed from a first electrical resistance and a second electrical resistance and wherein the second electrical resistance includes the electrical resistance of the second piezoresistive element, in that a phase-shifted difference signal is generated by a linear combination of the first phase-shifted comparison signal with a known temporally varying second phase-shifted comparison signal, in that the second phase-shifted comparison signal is generated by the phase-shifted demodulation signal; and wherein the second comparison signal is generated by a further voltage divider, which is formed from a third electrical resistance and a fourth electrical resistance, wherein the voltage divider and the further voltage divider are part of a bridge circuit, and wherein the first phase-shifted comparison signal and the second phase-shifted comparison signal are subtracted from one another to venerate the phase shifted difference signal, in that the phase-shifted difference signal is filtered by at least one element acting as a low-pass filter, thus generating a filtered phase-shifted difference signal.

2. The method according to claim 1, wherein the first comparison signal is filtered by at least one element acting as a low-pass filter, thus generating a filtered first comparison signal.

3. The method according to claim 1, wherein the oscillating element is a cantilever.

4. The method according to claim 3, wherein a difference signal is generated by a linear combination of the first comparison signal with a known temporally varying second comparison signal, wherein the difference signal is filtered by at least one element acting as a low-pass filter, thus generating a filtered difference signal, wherein the at least one sensor comprises a piezoresistive element and the sensor measurement variable is the electrical resistance of the piezoresistive element, wherein the demodulation signal is an AC voltage signal and that the first comparison signal is generated by a voltage divider, wherein the voltage divider is formed from a first electrical resistance and a second electrical resistance, and wherein the second electrical resistance comprises the electrical resistance of the piezoresistive element wherein the second comparison signal is generated by a further voltage divider, which is formed from a third electrical resistance and a fourth electrical resistance, wherein the voltage divider and the further voltage divider are preferably part of a bridge circuit, and wherein the first comparison signal and the second comparison signal are subtracted from one another to generate the difference signal the filtered difference signal is amplified with a constant gain factor and then subtracted from a target value in order to form a control signal, wherein the control signal is fed to a scanner control in order to adjust the distance between a sample and the cantilever.

5. The method according to claim 3, wherein the oscillating element is a cantilever of an atomic force microscope.

6. The method according to claim 1, wherein the demodulation signal is generated using the excitation signal.

7. The method according to claim 6, wherein the demodulation signal is generated as a linear function of the excitation signal.

8. The method according to claim 1, wherein a phase of the demodulation signal is shifted such that $$\phi=\phi_c$$

applies or $$\phi=\phi_c\pm\pi/2$$

wherein $\phi$ is the phase of the demodulation signal and $\phi_c$ is the phase of the modulated oscillation.

9. The method according to claim 1, wherein a difference signal is generated by a linear combination of the first comparison signal with a known temporally varying second comparison signal.

10. The method according to claim 9, wherein the difference signal is filtered by at least one element acting as a low-pass filter, thus generating a filtered difference signal.

11. The method according to claim 9, wherein the second comparison signal is generated using the demodulation signal.

12. The method according to claim 11, wherein the second comparison signal is generated as a linear function of the demodulation signal.

13. The method according to claim 1, wherein the defined known phase shift of the phase-shifted demodulation signal in relation to the demodulation signal is 90°.

14. The method according to claim 13,
wherein the phase-shifted demodulation signal is identical to the demodulation signal except for the defined known phase shift,
wherein the filtered difference signal and the filtered phase-shifted difference signal are processed by a signal processing unit in order to calculate an output amplitude and/or an output phase,
wherein the output amplitude is calculated according to $$A_{out}=((DIFFS\_f)^2+(DIFFS\_Q\_f)^2)^{1/2}$$

and/or the output phase is calculated according to $$\phi_{out}=atan(DIFFS\_Q\_f/DIFFS\_f),$$

wherein $A_{out}$ is the output amplitude, DIFFS_f is the filtered difference signal, DIFFS_Q_f is the filtered phase-shifted difference signal, $\phi_{out}$ is the output phase, and atan is the arc tangent.

15. The method according to claim 1, wherein the phase-shifted demodulation signal is identical to the demodulation signal except for the defined known phase shift.

16. The method according to claim 1, wherein the filtered difference signal and the filtered phase-shifted difference signal are processed by a signal processing unit in order to calculate an output amplitude and/or an output phase.

17. A control unit for demodulation, wherein the control unit is connectable to at least one excitation means for exciting a vibrationally mounted, at least sectionally bar-shaped oscillating element, wherein the control unit can be connected to at least one sensor for detecting a modulated oscillation of the oscillating element, wherein the control unit is formed to execute a method according to claim 1, wherein the at least one sensor comprises a piezoresistive element and the sensor measurement variable is the electrical resistance of the piezoresistive element, wherein a voltage divider is provided to generate the first comparison signal, wherein the voltage divider is formed from a first electrical resistance and a second electrical resistance, and wherein the second electrical resistance includes the electrical resistance of the piezoresistive element.

18. A device comprising a control unit according to claim 17, the device further comprising the at least one excitation means, wherein the control unit is connected to the at least one excitation means, the device further comprising the at least one sensor, wherein the control unit is connected to the at least one sensor, and the device including the oscillating element.

19. The device according to claim 18, wherein the at least one excitation means comprises a piezo actuator.

20. The device according to claim 18, wherein at least one low-pass filter is provided.

21. The device according to claim 18, wherein the oscillating element is a cantilever.

22. The device according to claim 21, wherein a scanner control is provided to adjust the distance between a sample and the cantilever.

23. The device according to claim 21, wherein the oscillating element is a cantilever of an atomic force microscope.

24. The device according to claim 17, wherein the device comprises a further voltage divider, which is formed from a third electrical resistance and a fourth electrical resistance, in order to generate a second comparison signal by the further voltage divider,
wherein the voltage divider and the further voltage divider are part of a bridge circuit.

25. The device according to claim 24, wherein a second sensor, comprising a second piezoresistive element essentially identical to the piezoresistive element, is provided whose sensor measurement variable is the electrical resistance of the second piezoresistive element,
in that a voltage divider is provided to generate the first phase-shifted comparison signal, wherein the voltage divider is formed from a first electrical resistance and a second electrical resistance and wherein the second electrical resistance includes the electrical resistance of the second piezoresistive element,
in that a further voltage divider is provided, which is formed from a third electrical resistance and a fourth electrical resistance to generate a second phase-shifted comparison signal by the further voltage divider,
wherein the voltage divider and the further voltage divider are part of a bridge circuit.

26. The device according to claim 25, wherein an AC voltage source is provided to generate the demodulation signal and an AC voltage source is provided to generate a phase-shifted demodulation signal.

27. The device according to claim 25, wherein a module for generating the difference signal and a phase-shifted difference signal is provided,
wherein a low-pass filter is provided to generate a filtered difference signal by filtering the difference signal, and a low-pass filter to generate a filtered phase-shifted difference signal by filtering the phase-shifted difference signal,
and a signal processing unit is provided to process the filtered difference signal and the filtered phase-shifted difference signal and to calculate an output amplitude and/or an output phase.

* * * * *